United States Patent
Pavao-Moreira et al.

(10) Patent No.: US 9,923,532 B2
(45) Date of Patent: Mar. 20, 2018

(54) SYSTEM AND METHOD TO DIRECTLY COUPLE TO ANALOG TO DIGITAL CONVERTER HAVING LOWER VOLTAGE REFERENCE

(71) Applicant: NXP USA, Inc., Austin, TX (US)

(72) Inventors: Cristian Pavao-Moreira, Frouzins (FR); Rex Kenton Hales, Mesa, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/480,097

(22) Filed: Apr. 5, 2017

(65) Prior Publication Data

US 2017/0294889 A1 Oct. 12, 2017

(30) Foreign Application Priority Data

Apr. 6, 2016 (EP) .................................... 16305396

(51) Int. Cl.
| | | |
|---|---|---|
| H03G 3/30 | (2006.01) | |
| H03F 3/19 | (2006.01) | |
| H03F 3/45 | (2006.01) | |
| H03F 3/72 | (2006.01) | |
| G01S 13/02 | (2006.01) | |

(52) U.S. Cl.
CPC ............ *H03G 3/3036* (2013.01); *H03F 3/19* (2013.01); *H03F 3/45094* (2013.01); *H03F 3/72* (2013.01); *G01S 13/0209* (2013.01); *H03F 2200/384* (2013.01); *H03F 2200/411* (2013.01); *H03F 2200/456* (2013.01); *H03F 2200/69* (2013.01); *H03F 2203/45061* (2013.01); *H03F 2203/45081* (2013.01); *H03F 2203/45112* (2013.01); *H03F 2203/7221* (2013.01); *H03G 2201/302* (2013.01); *H03G 2201/40* (2013.01)

(58) Field of Classification Search
CPC ....................................................... H03G 3/30
See application file for complete search history.

(56) References Cited

U.S. PATENT DOCUMENTS

| | | | |
|---|---|---|---|
| 7,271,651 | B2 | 9/2007 | Chen et al. |
| 8,410,846 | B2 | 4/2013 | Zare-Hoseini |
| 9,350,381 | B1 | 5/2016 | Doare et al. |
| 9,401,728 | B2 | 7/2016 | Doare et al. |

(Continued)

FOREIGN PATENT DOCUMENTS

| | | |
|---|---|---|
| JP | 2000-114895 A | 4/2000 |
| JP | 2011-077905 A | 4/2011 |
| WO | 2013/175681 A1 | 11/2013 |

*Primary Examiner* — Patricia T Nguyen (57) ABSTRACT

A device includes a variable gain amplifier, a voltage shifter, a variable gain amplifier half replica module, and an analog to digital converter. The variable gain amplifier includes an input terminal to receive an input signal, an output terminal to provide a first output signal that is biased based on a first common-mode voltage reference. The voltage shifter circuit includes first and second input terminals, and an output terminal to provide, to the analog to digital converter, a third output signal that is biased based on a second common-mode voltage reference. The variable gain amplifier half replica module includes an output terminal coupled to the second input terminal of the voltage shifter circuit, the variable gain amplifier half replica module to control the third output signal of the voltage shifter circuit based on the first common-mode voltage reference and the second common-mode voltage reference.

14 Claims, 6 Drawing Sheets

(56) References Cited

U.S. PATENT DOCUMENTS

2002/0175844 A1 11/2002 Bach et al.
2005/0151677 A1 7/2005 Chou
2010/0148844 A1 6/2010 Fayad et al.

SYSTEM AND METHOD TO DIRECTLY COUPLE TO ANALOG TO DIGITAL CONVERTER HAVING LOWER VOLTAGE REFERENCE

CROSS-REFERENCE TO RELATED APPLICATIONS

This application claims the priority under 35 U.S.C. § 119 of European Patent application no. 16305396.0, filed on Apr. 6, 2016, the contents of which are incorporated by reference herein.

BACKGROUND

Field of the Disclosure

A receiver or transceiver circuit of radar device can include a baseband interface circuit between the radar device and a microcontroller unit (MCU). In particular, the interface circuit can include an amplifier to provide a signal to either an internal analog to digital converter (ADC) of the receiver prior to the signal being provided to a MCU or with an ADC of a the MCU, which is external to the receiver (an external ACD). Both of the ADCs, e.g., internal and external, may have a different supply voltages than the supply voltage amplifier. Thus, the signal from the amplifier may exceed the input voltage range of the ADC, or even the supply voltage of the ADC, such that the amplifier cannot communicate with the ADC. One technique for interfacing circuit blocks with different power supplies is to insert a direct current blocking capacitor in the signal path. That solution has some drawbacks. For example, the blocking capacitor creates a high-pass filter that changes the frequency response of the system, and attenuates frequencies close to direct current. Larger values of capacitance may mitigate that effect. However, large values of capacitance may be impractical, especially when implemented on an integrated circuit, where such a capacitor may consume significant area.

The present disclosure may be better understood, and its numerous features and advantages made apparent to those skilled in the art by referencing the accompanying drawings.

BRIEF DESCRIPTION OF THE DRAWINGS

The use of the same reference symbols in different drawings indicates similar or identical items.

DETAILED DESCRIPTION

A device includes radio sub-system, which in turn includes different circuits specific to a radio front end, e.g., mixers, filters, and amplifiers. An output signal of the radio sub-system can be a baseband analog signal that is coupled to a variable gain amplifier. In an embodiment, the radio signals often have a wide range of amplitudes, and a smaller amplitude signal may need more gain than a larger amplitude signal. Therefore, a variable gain amplifier can provide an automatic gain control based on the amplitude of the input signal. The output signal of the variable gain amplifier can be coupled to a voltage follower amplifier, which in turn provides its output signal to an analog to digital converter. In particular, the output signal from the voltage follower amplifier can be provided to input terminals of the analog to digital converter.

The device can also include a replica variable gain amplifier that receives a common-mode voltage for the variable gain amplifier. In an embodiment, the components within the replica variable gain amplifier match as closely as possible to the components of the variable gain amplifier. The output voltage of the replica variable gain amplifier is coupled to a second voltage follower amplifier. In an embodiment, the power supply terminal of the variable gain amplifier and the replica variable gain amplifier are coupled to the same supply voltage terminal to receive a supply voltage, VH. The ground terminal of the variable gain amplifier and the replica variable gain amplifier are coupled to the same ground reference terminal. The power supply terminal of the first voltage follower and the second voltage follower amplifier are coupled to the same supply voltage terminal to receive a supply voltage, VH. The ground terminal of the first voltage follower and the second voltage follower amplifier are coupled to the same ground reference terminal. In this embodiment, the power supply terminal of the analog to digital converter is coupled to a different supply voltage, VL.

The output signal of the second voltage follower amplifier is coupled to a first terminal of a resistor. A second terminal of the resistor is coupled to a non-inverting input terminal of an amplifier. A third voltage reference is coupled to an inverting input terminal of the amplifier. In an embodiment, the third voltage reference is a desired common-mode voltage of the analog to digital converter. The output signal of the amplifier is then provided to a control terminal of a first transistor, and to the control terminal of a second transistor. A first current electrode of the first transistor is coupled to a first input terminal of the analog to digital converter, and a first current electrode of the second transistor is coupled to a second input terminal of the analog to digital converter. In operation, the amplifier drives a voltage on the control terminal of the first transistor until first transistor draws enough current through the resistor so that the voltage at the non-inverting input terminal of the amplifier is the common-mode voltage of the analog to digital converter. Because the resistor is a replica of the input resistor, and first transistor is a replica of the second transistor, the average voltage at a node of the analog to digital converter can also be a common-mode voltage of the analog to digital converter.

Figure 1:
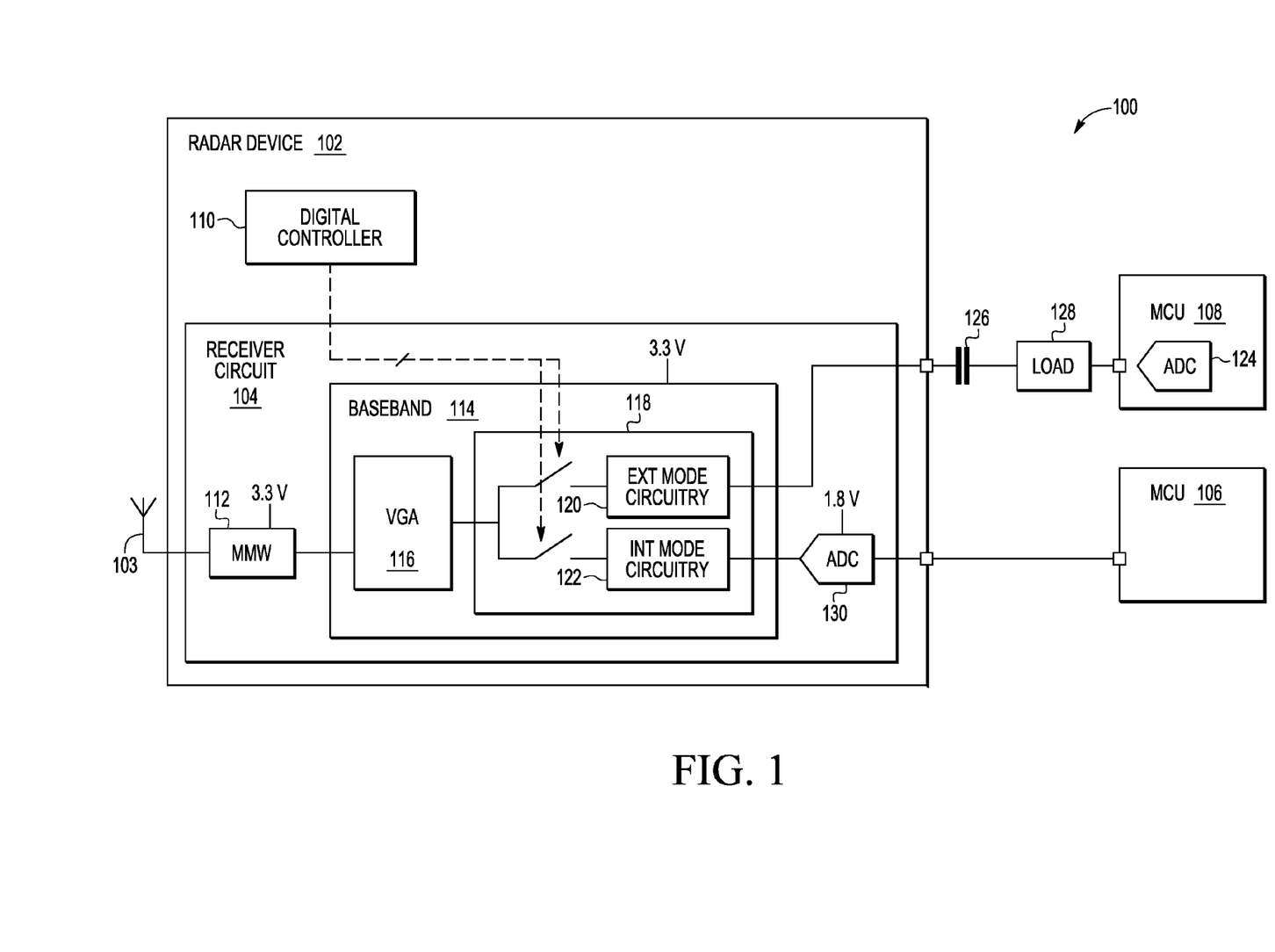
FIG. 1 illustrates a block diagram of a radar device in communication with multiple microcontroller units in accordance with at least one embodiment of the present disclosure.

FIG. 1 shows a diagram of a system 100 including a radar device 102, an antenna 103, and microcontrollers 106 and 108 to communicate with the radar device 102. The radar device 102 further includes various circuitry including a digital controller 110 and a receiver 104. The receiver 104 includes a millimeter wave module 112, and a baseband module 114. Baseband module 114 includes a variable gain amplifier 116 and a conversion module 118. The conversion module 118 includes external mode circuitry 120 and internal mode circuitry 122. The external mode circuitry 120 provides an output signal to an analog-to-digital converter (ADC) 124 of the microcontroller 108 through a capacitor 126 and a load 128. The internal mode circuitry 122 communicates with an ADC 130 of the baseband circuit 114. In an embodiment, the ADC 130 can be a continuous time delta-sigma converter.

The components of the baseband module 104 can be provided with one supply voltage via a voltage reference, and the ADC 130 can be provided with a lower supply voltage via a different voltage reference. In an embodiment, one supply voltage is 3.3 V, and the other supply voltage is 1.8 V.

During operation, the receiver circuit 104 of the radar device 102 can receive a baseband signal via the antenna 103, which can then be provided to the variable gain amplifier 116 of the baseband circuit 114 via the millimeter wave module 112, which modifies a received millimeter wave signal to become a baseband signal. In an embodiment, the millimeter wave module 112 can be a mixer that mixes a ~77 GHz signal with a ~77 GHz local oscillator to produce a baseband signal of 10 MHz or less. Other embodiments may use millimeter wave signals in a range from 76 GHz to 81 GHz, as well as at a lower frequency of around 24 GHz. The baseband signal could also be DC—20 MHz or DC—40 MHz or any other suitable baseband depending on the specifications of the baseband circuits and ADC. In an embodiment, the signal provided by the millimeter wave module 112 can be a differential signal that is biased around a common-mode mode voltage, $V_{CM}$, of the variable gain amplifier 116. Thus, the input voltage can be within an input voltage range of the variable gain amplifier 116.

The variable gain amplifier 116 can then amplify the input signal and provide the amplified signal to the conversion module 118, which in turn can provide the signal to either the ADC 124 of MCU 108 or to the ADC 130 on the receiver circuit 104. The digital controller module 110 can control which of the two MCUs 106 and 108 the signal is provided to based on a control signal sent to switch of the conversion module 118. For example, in response to a first switch of the conversion module being closed, the signal can be provided to the external mode circuitry 120, which in turn provides the signal to the ADC 124 of MCU 108. Alternatively, in response to a second switch of the conversion module being closed, the signal can be provided to the internal mode circuitry 122, which in turn provides the signal to the ADC 130 internal to the receiver circuit 104. In yet another embodiment, it is possible to have both switches closed to transmit a signal to both ADC 124 and ADC 130. For example, it may be desirable to close both switches if the two different ADCs have different bandwidth specs, their output signals could be combined to provide a result that has a wider bandwidth than either ADC can provide alone. Note that the external ADC isn't required to be in an MCU, but is illustrated as such for convenience of discussion.

In response to the first switch being closed, the external mode circuitry 120 can provide the signal to the external ADC 124 via an external pin of the radar device 102. In an embodiment, the capacitor 126 and the load 128 can be utilized to couple the radar device 102 to the MCU 108 and to provide the signal to the ADC 124 at a proper voltage that can be handled by the internal circuitry in ADC 124, which provides its own common mode bias. In an embodiment, the input voltage range of the ADC 130 can be lower than the input voltage range of the variable gain amplifier 116. Thus, if the signal is to be provided to the ADC 130, the internal mode circuitry 122 can convert the signal to be biased based on a common-mode input voltage, $V_{CMADC}$, of the ADC 130 instead of the common-mode output voltage of the variable gain amplifier 116 as will be described in greater detail with respect to FIGS. 2 and 3 below.

Although device 102 includes separate external pins to provide output signals to MCUs 106 and 108, in an embodiment, device 102 could include only a single external pin for providing output signals to the MCUs. In this embodiment, the ADC 130 and the external mode circuitry 120 would provide their respective output signals via the same external pin depending on the state of the switches in the baseband circuit 114. Thus, in this embodiment, the device 102 can utilize the same external pin to provide the digital output signal of the internal ADC 130 to MCU 106 and to provide an analog signal to MCU 108.

Figure 2:
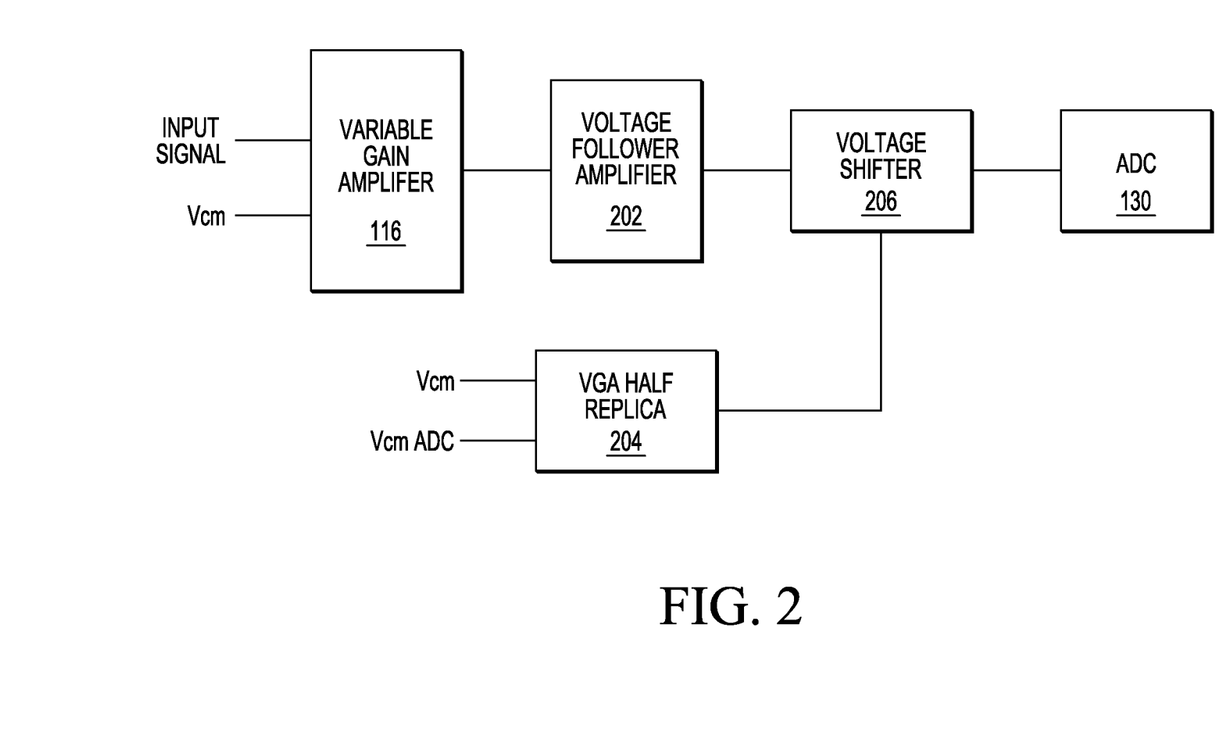
FIG. 2 illustrates a block diagram of a portion of a baseband module in the radar device in FIG. 1 in accordance with at least one embodiment of the present disclosure.

FIG. 2 shows block diagram of a portion of the baseband module 114, of FIG. 1, including the variable gain amplifier 116, a voltage follower amplifier 202, a variable gain amplifier half replica module 204, a voltage shifter 206, and the ADC 130 in accordance with at least one embodiment of the present disclosure. The variable gain amplifier 116 includes an input terminal and an output terminal. The voltage follower amplifier 202 includes an input terminal coupled to the output terminal of the variable gain amplifier 116, and an output terminal. The variable gain amplifier half replica 204 includes two input terminals and an output terminal. The voltage shifter 206 includes a first input terminal coupled to the output terminal of the voltage follower amplifier 202, a second input terminal coupled to the output terminal of the variable gain amplifier half replica 204, and an output terminal. The ADC 130 includes an input terminal coupled to the output terminal of the voltage shifter 206. In the embodiment, of FIG. 2 the output signals, e.g., the signals output from the variable gain amplifier 116, the voltage follower amplifier 202, and the voltage shifter 206, can be single-ended signals. In this embodiment, the variable gain amplifier 116, the voltage follower amplifier 202, and the voltage shifter 206 can have only a single output terminal. In another embodiment, the output signals can be differential signals as represented in FIG. 3 below.

During operation, the variable gain amplifier 116 can receive the input signal, e.g., from the millimeter wave module 112 of FIG. 1, which can be biased with a common-mode voltage, $V_{CM}$. The variable gain amplifier 116 can amplify the input signal and provide an output voltage biased around the common-mode voltage, $V_{CM}$. It is also possible that the input and output common modes of the variable gain amplifier 116 are different, which is the case in FIG. 3. The voltage follower amplifier 202 can be a low impedance amplifier, and the voltage follower amplifier 202 can be a buffer that outputs a signal that follows the output signal of the variable gain amplifier 116. The VGA half replica 204 can receive the a first voltage equal to the common-mode voltage of the VGA 116, $V_{CM}$, and a second voltage equal to the common-mode voltage of the ADC 130, $V_{CMADC}$, and can utilize these voltages to regulate an output signal of the VGA half replica 204. In an embodiment, the VGA half replica 204 can include a single amplifier while the variable gain amplifier 116 can include two amplifier circuits. In this embodiment, the VGA half replica 204 can include half of the components that are in the variable gain amplifier 116, but those components in the VGA half replica 204 can be substantially similar to the corresponding components in the variable gain amplifier 116. In another embodiment, the system can a single ended system, and the variable gain amplifier 116 can include only one amplifier circuit. In this embodiment, the VGA half replica 204 can include all of the same components as the variable gain amplifier 116 components in the VGA half replica 204, and the components of the VGA half replica 204 can be substantially similar to the corresponding components in the variable gain amplifier 116.

The output signal of the voltage follower amplifier 202 can be provided to the first input terminal of the voltage shifter 206, and the output voltage of the VGA half replica 204 can be provided to the second input terminal of the voltage shifter 206. In a different embodiment, the voltage shifter 206 can include input resistors of a first integrator stage of the ADC 130 or can include resistors that are separate from the ADC 130. The output voltage of the VGA half replica 204 can control the level that the voltage output from the voltage follower amplifier 202 is reduced in the voltage shifter 206. In an embodiment, variations in supply voltage or temperature may cause some variations in the variable gain amplifier 116. However, because the components in the variable gain amplifier half replica module 204 match the corresponding components in the signal path, the same variations occur in variable gain amplifier half replica module 204. Therefore, the voltage shifter 206 produces the correct reduction in the voltage, in spite of temperature and supply voltage variations. The reduced voltage is output from the voltage shifter 206 and provided to the input terminal of the ADC. In an embodiment, the output voltage from the voltage shifter 206 is preferably kept at the common-mode voltage of the ADC 130, $V_{CMADC}$, as will be described in greater detail below with respect to FIG. 3. In another embodiment, the voltage could also be increased or alternatively increased or decreased as needed due to changes in the VGA supply voltage, process variations, temperature changes, or the like. In this embodiment, the voltage can be increased or decrease as a result of a constant current source connected to into Vinp and Vinn in FIG. 3 below.

Figure 3:
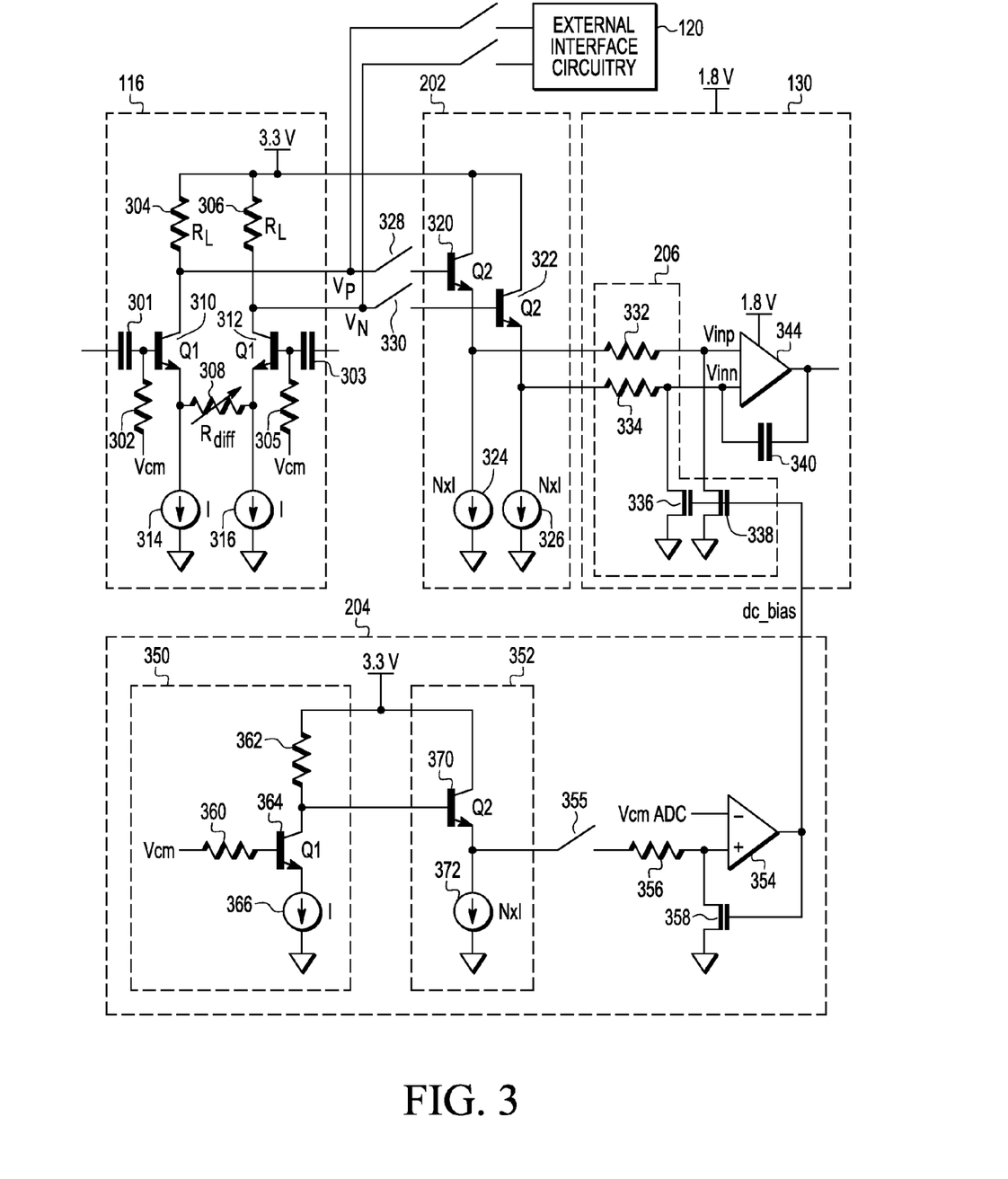
FIG. 3 illustrates a schematic diagram of the portion of the baseband module in FIG. 2 in accordance with at least one embodiment of the present disclosure.

FIG. 3 shows a schematic diagram portion of the baseband module 114, of FIG. 1, including the variable gain amplifier 116, the voltage follower amplifier 202, the variable gain amplifier half replica module 204, the voltage shifter 206, and the ADC 130 in accordance with at least one embodiment of the present disclosure. The variable gain amplifier 116 includes capacitors 301 and 303, resistors 302, 304, 305, 306, and 308, transistors 310 and 312, and current sources 314 and 316. The voltage follower amplifier 202 includes transistors 320 and 322, and current sources 324 and 326. The variable gain amplifier 116 is coupled to the voltage follower amplifier 202 via switches 328 and 330. The voltage shifter 206 includes resistors 332 and 334, and transistors 336 and 338. The ADC 130 includes the capacitor 340, amplifier 344, and the resistors 332 and 334 of the voltage shifter 206. The variable gain half amplifier module 204 includes a replica variable gain amplifier 350, a replica voltage follower amplifier 352, an operational amplifier 354, a switch 355, a resistor 356, and a transistor 358. The replica variable gain amplifier 350 includes resistors 360 and 362, a transistor 364, and a current source 366. The replica voltage follower amplifier 352 includes a transistor 370 and a current source 372. In another embodiment, the internal mode circuity, shown in FIG. 3, can be a single ended implementation. In this situation, a single ended signal would be utilized and the replica circuits in the variable gain half amplifier module 204 would be full replicas instead of a half replicas.

During operation, the variable gain amplifier 116 receives an analog signal to be converted to a digital signal by an ADC that can be internal to, or external from, the receive that includes the variable gain amplifier 116. This digital signal is used by an MCU, such as MCU 106 of FIG. 1. In an embodiment, the signal to be converted is received at the capacitor 301 from a radio system, such as the millimeter wave module 112. The input signal can then be biased based on the voltage coupled to the resistor 302. In an embodiment, the voltage at resistor 302 is the common-mode voltage, $V_{CM}$. In an embodiment, the common-mode voltage is one-half of the supply voltage of the variable gain amplifier 116. The biased input signal can then be provided to control terminal of transistor 310. The transistors 310 and 312 preferably form a differential pair. In an embodiment, transistors 310 and 312 can be NPN transistors. In an embodiment, the current source 314 provides the same amount as current source 316. The resistor 308 can be a variable resistor, wherein the change in the value of resistor 308 can adjust the gain magnitude of the variable gain amplifier 116. The resistor 304 forms a first load of the variable gain amplifier 116, and produces a voltage Vp. The resistor 306 forms a second load of the variable gain amplifier 116, and produces a voltage Vn. In this example, the signal output from the variable gain amplifier 116 is represented differentially by Vp and Vn. However, a system can utilize single-ended signals without varying from the scope of this disclosure.

The signal is then provided to the voltage follower amplifier 202 in response to the switches 328 and 330 being closed. Alternatively, the signal can be provided to the external mode circuitry 120 if the signal is to be sent to the ADC 124 of the MCU 108. In one embodiment, this signal path can be implemented using an emitter-follower amplifier.

The voltage follower amplifier 202 is the next step in signal conditioning. Transistor 320 and current source 324 amplify the current in the Vp branch of the differential pair based on the amount of current sourced by the current source 324. Similarly, transistor 322 and current source 326 amplify the current in the Vn branch based on the amount of current sourced by the current source 326. In an embodiment, transistors 320 and 322 can be NPN transistors, and the output signals of the voltage follower amplifier 202 are developed at the emitters of the transistors 320 and 322. As long as the base to emitter voltages of the transistors 320 and 322 are large enough to forward bias the PN junctions at the emitters, the output signals of voltage follower amplifier 202 will tend to follow the input signals. In an embodiment, the current sources 324 and 326 help keep the base-emitter junctions of transistors 320 and 322 forward biased, and allows the output voltage to change without much change in current. In an embodiment, the voltage follower amplifier 202 can deliver current to the load in an amount of base current times the beta of the transistors 320 and 322, and the availability of that current gives the amplifier 202 a low output impedance.

The signal can then be provided to the voltage shifter 206 to convert the signal to an input voltage range of the ADC 130. A first section of ADC 130 receives the differential signal through ADC input resistors 332 and 334. Input resistor 332 has a first terminal coupled to the output terminal of the Vp branch of the low impedance voltage follower amplifier 202, and a second terminal coupled to the input terminal of amplifier 344 of the ADC 130. Input resistor 334 has a first terminal coupled to the output terminal of the Vn branch of the voltage follower amplifier 202, and a second terminal coupled to an inverting input terminal of amplifier 344. Transistor 336 has control terminal, a first current electrode coupled to the second terminal of resistor 334, and a second current electrode coupled to a ground voltage reference. Resistor 334 and transistor 336 combine to form a voltage shifter on the Vn branch of the signal. Transistor 338 has a control terminal, a first current electrode coupled to the second terminal of resistor 332, and a second current electrode coupled to the ground voltage reference. Resistor 332 and transistor 338 combine to form a voltage shifter on the Vp branch of the signal. The voltage drop across the voltage shifters is controlled by the output voltage from variable gain amplifier half replica module 204.

The replica variable gain amplifier 350 is constructed to match components in one branch of the variable gain amplifier 116, such that resistor 360 matches resistor 302 and receives the common-mode voltage, $V_{CM}$, transistor 364 matches transistor 310, current source 366 matches current source 314, and resistor 362 matches resistor 304. Thus, the output voltage of the replica variable gain amplifier 350 produces a voltage based on the common-mode voltage, $V_{CM}$, similarly to that of the variable gain amplifier 116. The output voltage of the replica variable gain amplifier 350 is provided to the replica voltage follower amplifier 352.

The components of the replica voltage follower amplifier 352 are constructed to match corresponding components in one branch of the voltage follower amplifier 202. In particular, transistor 370 matches transistor 320, and current source 372 matches current source 324. Thus, output voltage of the replica voltage follower amplifier 352 follows the output voltage of the replica variable gain amplifier 350 similarly to the manner of the voltage follower amplifier 202.

The amplifier 354 includes an inverting input terminal to receive the common-mode voltage, $V_{CMADC}$, of the ADC 130, a non-inverting input terminal, and an output terminal. A replica ADC input resistor 356 has a first terminal that is coupled to the output terminal of replica voltage follower amplifier 352 via switch 355, and a second terminal coupled to the non-inverting input terminal of the replica amplifier 354. The signal is provided from the replica voltage follower amplifier 352 to the replica AC input resistor 356 in response to the switch 355 being closed. In an embodiment, the switch 355 can mirror the switches 328 and 330, e.g., switch 355 is closed when switches 328 and 330 are closed, and switch 355 is open when switches 328 and 330 are open.

In an embodiment, the replica resistor 356 is constructed to match ADC input resistor 332. The transistor 358 includes a control terminal coupled to the output terminal of the amplifier 354, a first current electrode coupled to the non-inverting input terminal of amplifier 354 and to the second terminal of the replica resistor 356, and a second current electrode coupled to the ground voltage reference. In an embodiment, the operation of amplifier 354 is control based on the switch 355, e.g., the amplifier 354 is operational when the switch 355 is closed and not operational when switch 355 is open. In an embodiment, the transistor 358 is constructed to match transistor 336.

The resistor 356 and transistor 358 form a voltage shifter at the non-inverting input terminal of the amplifier 354. The amplifier 354 can drive a voltage onto the control terminal of transistor 358 based on the difference between the voltages at the inverting and non-inverting input terminals of the amplifier 354. In an embodiment, transistor 358 is a n channel field effect transistor (FET), such that higher voltages on the control terminal the more current sourced through transistor 358. The current through transistor 358 flows through resistor 356, causing a voltage drop across resistor 356, and lowering the voltage at the non-inverting input terminal of amplifier 354. The feedback of the amplifier 354 is balanced in response to transistor 358 drawing enough current across resistor 356 to maintain the common-mode voltage, $V_{CMADC}$, of the ADC 130 at the non-inverting input terminal amplifier 354.

The voltage applied to the control terminal of transistor 338 allows a specific amount of current to flow through resistor 332, so that excess voltage is dropped across resistor 332, and the resultant voltage VINP meets the common-mode requirements of the amplifier 344. Amplifier 344 has the capacitor 340 coupled between the output terminal and the negative input terminal of amplifier 344, forming an integrator stage. The output signal from amplifier 344 goes on to more stages inside the ADC 130, which for brevity are not shown or discussed. Similarly, the voltage applied to the control terminal of transistor 336 allows a specific amount of current to flow through resistor 334, so that excess voltage is dropped across resistor 334, and the resultant voltage VINN meets the common-mode requirements of the amplifier 344. In an embodiment, the transistors 336 and 338 are variably active, e.g., the transistors are only active when amplifier 354 provides an output voltage, e.g., when switch 355 is closed. In an embodiment, the common-mode voltage of the amplifier 344 is the common-mode voltage of the ADC 130, $V_{CMADC}$, e.g., 0.9 V. The common-mode voltage of the ADC 130, $V_{CMADC}$, is less than the common-mode voltage of the variable gain amplifier, $V_{CM}$, e.g., 1.8 V.

When amplifier 354 drives enough voltage to achieve the common-mode voltage, $V_{CMADC}$, at the non-inverting input terminal to amplifier 354 that same voltage can cause the common-mode voltage, $V_{CMADC}$, to bias the differential signal at VINN and VINP based on the common features of the resistors 332 and 334 and the transistors 336 and 338 as compared to resistor 356 and transistor 358. Thus, the signal provided to the amplifier 344 is biased to the proper common-mode voltage, $V_{CMADC}$, for the amplifier 344.

Variations in supply voltage or temperature may cause some variations in the variable gain amplifier 116, the voltage follower amplifier 202, resistors 332 and 334, and transistors 336 and 338. However, because the components in the variable gain amplifier half replica module 204 match the corresponding components in the signal path, the same variations occur in replica variable gain amplifier 350, replica voltage follower amplifier 352, resistor 356, and the transistor 358. Therefore, the correct common-mode voltage, $V_{CMADC}$, is maintained at the ADC amplifier 344, in spite of temperature and supply voltage variations. Thus, direct coupling between variable gain amplifier 116 and the ADC 130 is enabled even though the supply voltages are different between variable gain amplifier 116 and the ADC 130. Additionally, the direct coupling between variable gain amplifier 116 and the ADC 130 is enabled even if the ground references are different between the variable gain amplifier 116 and the ADC 130.

Figure 4:
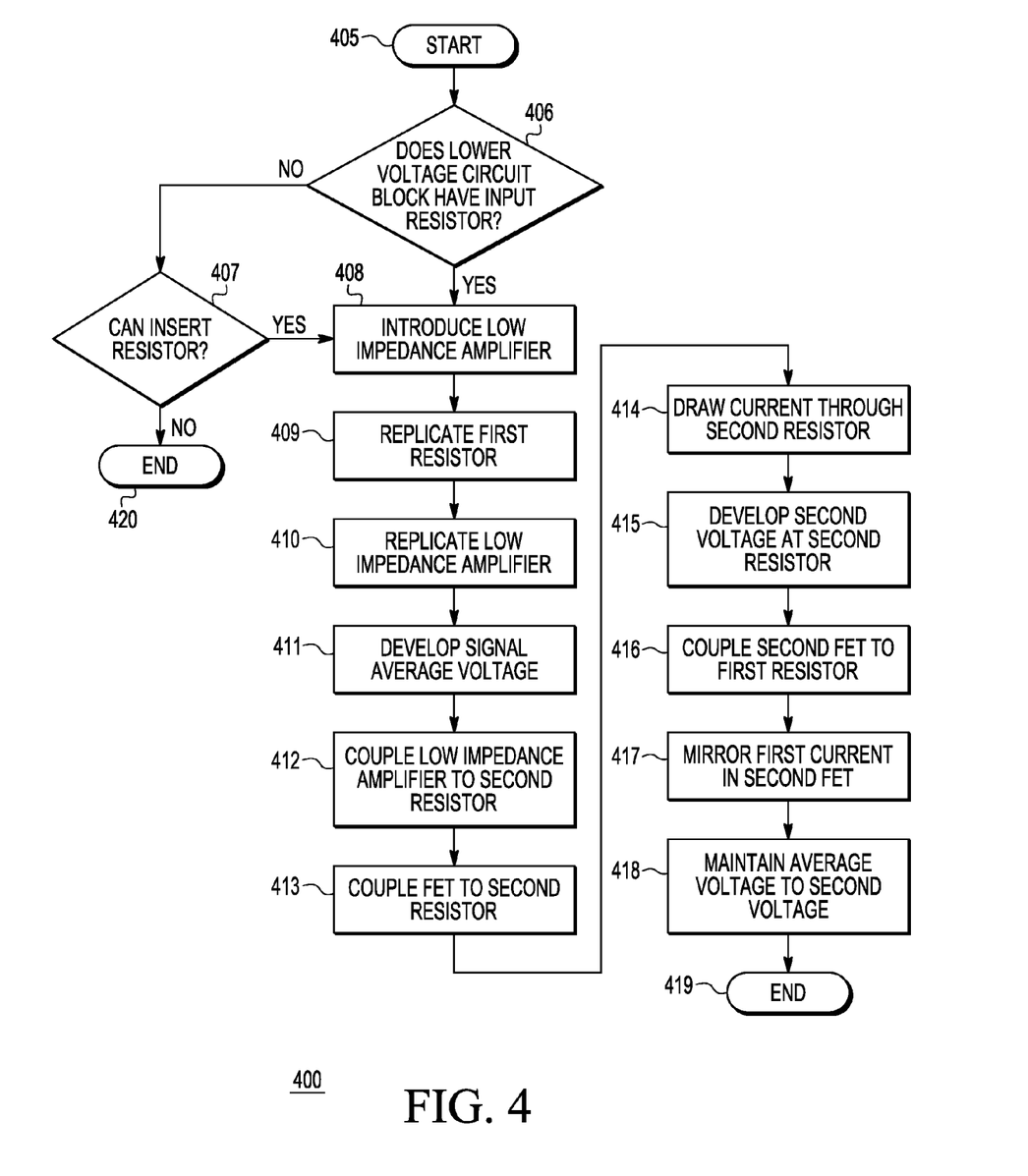
FIG. 4 illustrates a flow diagram of a method for coupling a receiver circuit to an analog to digital converter in accordance with at least one embodiment of the present disclosure.

FIG. 4 illustrates a flow diagram of a method 400 for making a receiver circuit to an analog to digital converter in accordance with at least one embodiment of the present disclosure. The method starts at block 405. At block 406, a test is performed to determine whether a lower supply voltage circuit includes an input resistor. In an embodiment, the lower supply voltage circuit is a portion of a device that is provided with a lower supply voltage as compared to another portion of the device. In an embodiment, the lower supply voltage circuit is the ADC 130 of FIG. 1.

If it is possible, the input resistor is inserted, and the flow proceeds to block 408. However, if the lower supply voltage circuit does not have an input resistor, flow proceeds to block 407, and a determination is made whether an input resistor may be inserted into the circuit. In an embodiment, certain circuits in the lower supply voltage circuit may be able to have a resistor inserted. If it is not possible, the method ends at block 420. However, if the circuit has an input resistor, flow proceeds to block 408, and a first low impedance amplifier is introduced into the device. In an embodiment, the first low impedance amplifier is the voltage follower amplifier 202 of FIG. 2.

At block 409, the first resistor is replicated as a second resistor in the device. The first low impedance amplifier is replicated as a second low impedance amplifier in the device at block 410. At block 411, a signal average voltage is developed. In an embodiment, the signal average voltage based on a voltage divider between a supply voltage and a ground. In an embodiment, the signal average voltage is the common-mode voltage of the ADC 130, $V_{MCADC}$. In an embodiment, an alternating input signal to the device can vary around the signal average voltage.

At block 412, an output terminal of the second low impedance amplifier is coupled to a first terminal of the second resister. A first transistor is introduced into the device at block 413. In an embodiment, the first transistor includes a first current electrode coupled to a second terminal of the second resistor, and a second current electrode coupled to a ground voltage reference. At block 414, a first current is drawn through the second resistor. In an embodiment, the first current can be drawn through the second resistor by applying an appropriate voltage to the control terminal of the first transistor and thereby the second transistor sources current through the second resistor. At block 415, a second voltage is developed at the second terminal of the second resistor based on the current drawn through the second resistor. In an embodiment, the second voltage is the desired common-mode voltage, $V_{CMADC}$, at the input terminal to the lower supply voltage circuit. In an embodiment, the second voltage could be developed with an amplifier driving the control terminal of the first transistor, as described above and shown in amplifier 354 of FIG. 3.

At block 416, a second transistor is coupled to a second terminal of the first resistor. At block 417, a second current through the second transistors is matched to the first current in the first transistor. In an embodiment, the second current can be matched to the first current by coupling the control terminal of the first transistor to the control terminal of the second transistor. At block 418, an average voltage is maintained at the second terminal of the first resistor based on the voltage developed at second terminal of the second resistor. In an embodiment, the average voltage is maintained based on the first resistor and the second resister forming a voltage divider. The flow ends at block 419.

Figure 5:
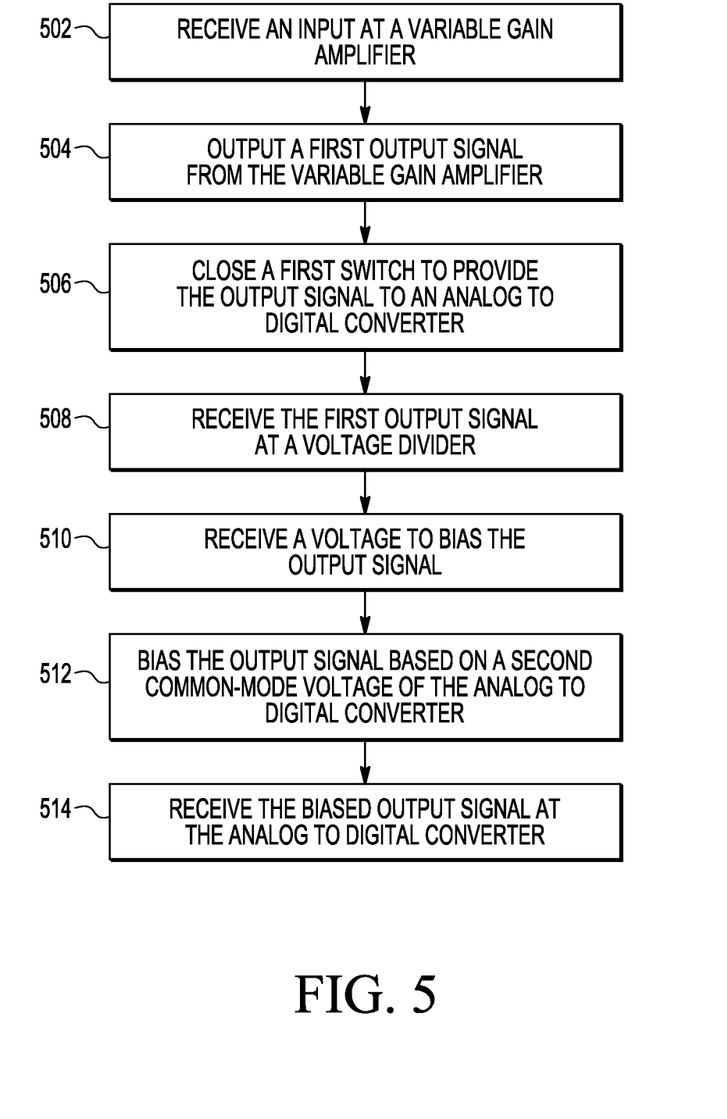
FIG. 5 illustrates a flow diagram of a method for converting an output voltage of an amplifier to a voltage range that an analog to digital converter can receive in accordance with at least one embodiment of the present disclosure.

FIG. 5 illustrates a flow diagram of a method for converting an output voltage of an amplifier to a voltage range that an analog to digital converter can receive in accordance with at least one embodiment of the present disclosure. At block 502, an input signal is received at the variable gain amplifier 116. In an embodiment, the variable gain amplifier has a first supply voltage. In an embodiment, the variable gain amplifier is the variable gain amplifier 116 of FIG. 1. A first output signal is output from the variable gain amplifier at block 504. In an embodiment, the first output signal is biased based on a first common-mode voltage of the variable gain amplifier.

At block 506, a first switch is closed to provide the first output signal to the voltage shifter in response to a determination that the input signal is to be provided to the analog to digital converter. The first output signal is received at a voltage shifter at block 508. At block 510, a voltage to control the biasing of the output signal is received at the voltage shifter. In an embodiment, the variable gain amplifier half replica module 204 can provide the voltage to control the biasing of the output signal to the voltage shifter 206. The first output signal is biased at a second common-mode voltage of an analog to digital converter at block 512. At block 514, the first output signal biased at the second common-mode voltage is received at the analog to digital converter.

Figure 6:
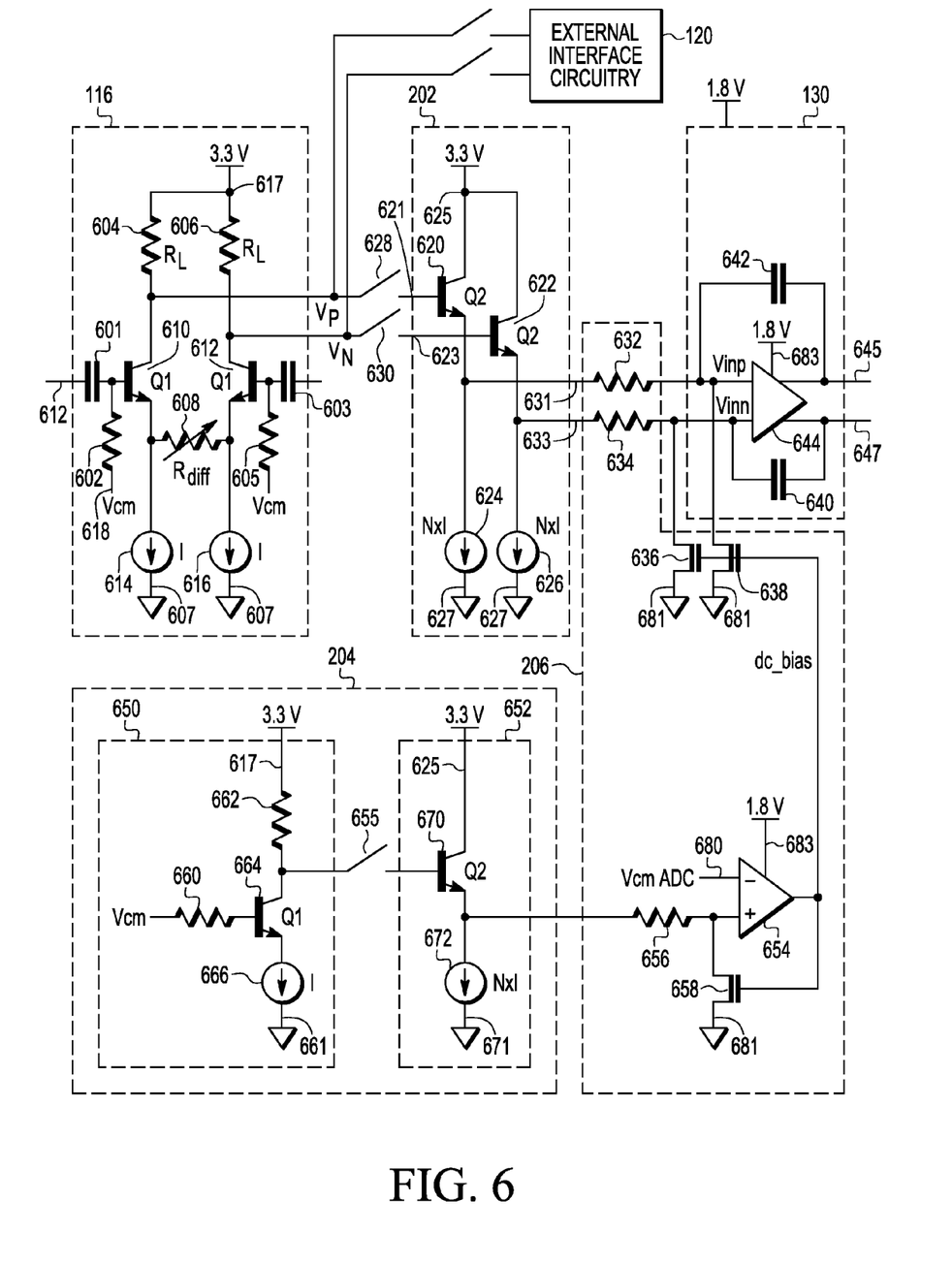
FIG. 6 illustrates a alternate schematic diagram of the portion of the baseband module in FIG. 2 in accordance with at least one embodiment of the present disclosure.

FIG. 6 shows an alternate schematic diagram portion of the baseband module 114, of FIG. 1, including the variable gain amplifier 116, the voltage follower amplifier 202, the variable gain amplifier half replica module 204, the voltage shifter 206, and the ADC 130 in accordance with at least one embodiment of the present disclosure. The variable gain amplifier 116 includes capacitors 601 and 603, resistors 602, 604, 605, 606, and 608, transistors 610 and 612, and current sources 614 and 616. The voltage follower amplifier 202 includes transistors 620 and 622, and current sources 624 and 626. The variable gain amplifier 116 is coupled to the voltage follower amplifier 202 via switches 628 and 630. The voltage shifter 206 includes transistors 636 and 638, an operational amplifier 654, a resistor 656, and a transistor 658. The ADC 130 includes the capacitor 640, amplifier 644, and the resistors 632 and 634 of the voltage shifter 206. The variable gain half amplifier module 204 includes a replica variable gain amplifier 650, a replica voltage follower amplifier 652, and a switch 655. The replica variable gain amplifier 650 includes resistors 660 and 662, a transistor 664, and a current source 666. The replica voltage follower amplifier 652 includes a transistor 670 and a current source 672. In another embodiment, the internal mode circuity, shown in FIG. 6, can be a single ended implementation. In this situation, a single ended signal would be utilized and the replica circuits in the variable gain half amplifier module 204 would be full replicas instead of a half replicas.

During operation, the variable gain amplifier 116 receives an analog signal to be converted to a digital signal by an ADC that can be internal to, or external from, the receive that includes the variable gain amplifier 116. This digital signal is used by an MCU, such as MCU 106 of FIG. 1. In an embodiment, the signal to be converted is received at an input terminal 612 coupled to the capacitor 601 from a radio system, such as the millimeter wave module 112. The input signal can then be biased based on the voltage coupled to the resistor 602 at terminal 618. In an embodiment, the voltage at resistor 602 is the common-mode voltage, $V_{CM}$, provided via terminal 618. In an embodiment, the common-mode voltage is one-half of the supply voltage of the variable gain amplifier 116. In other embodiments, the common-mode voltage can be a voltage level other than one-half of the supply voltage of the variable gain amplifier 116. The biased input signal can then be provided to control terminal of transistor 610. The transistors 610 and 612 preferably form a differential pair. In an embodiment, transistors 610 and 612 can be NPN transistors. In an embodiment, the current source 614 provides the same amount as current source 616. The resistor 608 can be a variable resistor, wherein the change in the value of resistor 608 can adjust the gain magnitude of the variable gain amplifier 116.

In an embodiment, the variable gain amplifier 116 is provided a supply voltage, such as 3.3 V, at a supply terminal 617 coupled to the resistors 604 and 606. In an embodiment, the variable gain amplifier 116 is coupled to a ground potential via the current sources 614 and 616 each being coupled to ground terminal 607. The resistor 604 forms a first load of the variable gain amplifier 116, and produces a voltage Vp, which is provide to a first input terminal 621 of the voltage follower amplifier 202. The resistor 606 forms a second load of the variable gain amplifier 116, and produces a voltage Vn, which is provided to a second input terminal 623 of the voltage follower amplifier 202. In this example, the signal output from the variable gain amplifier 116 is represented differentially by Vp and Vn. However, a system can utilize single-ended signals without varying from the scope of this disclosure.

The signal is then provided to the input terminals 621 and 623 of the voltage follower amplifier 202 in response to the switches 628 and 630 being closed. Alternatively, the signal can be provided to the external mode circuitry 120 if the signal is to be sent to the ADC 124 of the MCU 108. In one embodiment, this signal path can be implemented using an emitter-follower amplifier.

The voltage follower amplifier 202 is the next step in signal conditioning. Transistor 620 and current source 624 amplify the current in the Vp branch of the differential pair based on the amount of current sourced by the current source 624. Similarly, transistor 622 and current source 626 amplify the current in the Vn branch based on the amount of current sourced by the current source 626. In an embodiment, transistors 620 and 622 can be NPN transistors, and the output signals of the voltage follower amplifier 202 are developed at the emitters of the transistors 620 and 622.

As long as the base to emitter voltages of the transistors 620 and 622 are large enough to forward bias the PN junctions at the emitters, the output signals of voltage follower amplifier 202 will tend to follow the input signals. Thus, the output signals of the transistors 620 and 622 in the voltage follower amplifier 202 are fundamentally dependent on the voltage at bases of the transistors 620 and 622, which in turn are set by the currents through resistors 604 and 606 by current sources 614 and 616, and the supply voltage at supply terminal 625. The output signals can also be dependent on a high temperature and process dependence of Vbe of the transistors 620 and 622. The currents of current sources 624 and 626 are replica currents of the currents of current sources 614 and 616, such that a change to the supply voltage of the voltage follower amplifier 202 or a change in Vbe of the transistors 620 and 622 can be corrected in the voltage follower amplifier 202.

In an embodiment, the current sources 624 and 626 help keep the base-emitter junctions of transistors 620 and 622 forward biased, and allows the output voltage to change without much change in current. In an embodiment, the voltage follower amplifier 202 can deliver current to the load in an amount of base current times the beta of the transistors 620 and 622, and the availability of that current gives the amplifier 202 a low output impedance. In an embodiment, the voltage follower amplifier 202 is provided a voltage, such as 3.3 V, at the supply terminal 617 coupled to a control terminal of transistor 620 via resistor 604 and to a control terminal of transistor 622 via resistor 606. In an embodiment, the voltage follower amplifier 202 is coupled to a ground potential via the current sources 624 and 626 each being coupled to ground terminal 627.

The signal can then be provided to input terminals 631 and 633 of the ADC 130. A first section of ADC 130 receives the differential signal through ADC input resistors 632 and 634. Input resistor 632 has a first terminal coupled to the output terminal of the Vp branch of the low impedance voltage follower amplifier 202, via input terminal 631, and a second terminal coupled to the input terminal of amplifier 644 of the ADC 130. Input resistor 634 has a first terminal coupled to the output terminal of the Vn branch of the voltage follower amplifier 202, via input terminal 633, and a second terminal coupled to an inverting input terminal of amplifier 644. Transistor 636 has control terminal, a first current electrode coupled to the second terminal of resistor 634, and a second current electrode coupled to a ground voltage reference at ground terminal 681. Resistor 634 and transistor 636 combine to form a voltage shifter on the Vn branch of the signal. Transistor 638 has a control terminal, a first current electrode coupled to the second terminal of resistor 632, and a second current electrode coupled to the ground voltage reference at ground terminal 681. Resistor 632 and transistor 638 combine to form a voltage shifter on the Vp branch of the signal. The voltage drop across the voltage shifters is controlled by the output voltage from variable gain amplifier half replica module 204.

The replica variable gain amplifier 650 is constructed to match components in one branch of the variable gain amplifier 116, such that resistor 660 matches resistor 602 and receives the common-mode voltage, $V_{CM}$, transistor 664 matches transistor 610, current source 666 matches current source 614, and resistor 662 matches resistor 604. Thus, the output voltage of the replica variable gain amplifier 650 produces a voltage based on the common-mode voltage, $V_{CM}$, similarly to that of the variable gain amplifier 116. The output voltage of the replica variable gain amplifier 650 is provided to the replica voltage follower amplifier 652. In an embodiment, the replica variable gain amplifier 650 is provided a supply voltage, such as 3.3 V, at the supply terminal 617 coupled to the resistor 662, which is the same supply terminal 617 coupled to the resistors 604 and 606 of variable gain amplifier 116. In an embodiment, the replica variable gain amplifier 650 is coupled to a ground potential via the current source 666 coupled to ground terminal 661.

The components of the replica voltage follower amplifier 652 are constructed to match corresponding components in one branch of the voltage follower amplifier 202. In particular, transistor 670 matches transistor 620, and current source 672 matches current source 624. Thus, output voltage of the replica voltage follower amplifier 652 follows the output voltage of the replica variable gain amplifier 650 similarly to the manner of the voltage follower amplifier 202 in response to switch 655 being closed. In an embodiment, the switch 655 can mirror the switches 628 and 630, e.g., switch 655 is closed when switches 628 and 630 are closed, and switch 655 is open when switches 628 and 630 are open. In an embodiment, the replica voltage follower amplifier 652 is provided a supply voltage, such as 3.3 V, at the supply terminal 625 coupled to the resistor a first current electrode of transistor 670, which is the same supply terminal 625 coupled to the first current electrode of transistor 620 and to the first current electrode of transistor 622. In an embodiment, the replica voltage follower amplifier 652 is coupled to a ground potential via the current source 672 coupled to ground terminal 671.

The amplifier 654 includes an inverting input terminal to receive the common-mode voltage, $V_{CMADC}$, of the ADC 130 via input terminal 680, a non-inverting input terminal, and an output terminal. A replica ADC input resistor 656 has a first terminal that is coupled to the output terminal of replica voltage follower amplifier 652, and a second terminal coupled to the non-inverting input terminal of the amplifier 654.

In an embodiment, the replica resistor 656 is constructed to match ADC input resistor 632. The transistor 658 includes a control terminal coupled to the output terminal of the amplifier 654, a first current electrode coupled to the non-inverting input terminal of amplifier 654 and to the second terminal of the replica resistor 656, and a second current electrode coupled to the ground voltage reference via ground terminal 681. The amplifier 654 is provided a supply voltage, such as 1.8 V, via a supply terminal 683. In an embodiment, the transistor 658 is constructed to match transistor 636.

The resistor 656 and transistor 658 form a voltage shifter at the non-inverting input terminal of the amplifier 654. The amplifier 654 can drive a voltage onto the control terminal of transistor 658 based on the difference between the voltages at the inverting and non-inverting input terminals of the amplifier 654. In an embodiment, transistor 658 is a n channel field effect transistor (FET), such that higher voltages on the control terminal the more current sourced through transistor 658. The current through transistor 658 flows through resistor 656, causing a voltage drop across resistor 656, and lowering the voltage at the non-inverting input terminal of amplifier 654. The feedback of the amplifier 654 is balanced in response to transistor 658 drawing enough current across resistor 656 to maintain the common-mode voltage, $V_{CMADC}$, of the ADC 130 at the non-inverting input terminal amplifier 654.

The voltage applied to the control terminal of transistor 638 allows a specific amount of current to flow through resistor 632, so that excess voltage is dropped across resistor 632, and the resultant voltage VINP meets the common-mode requirements of the amplifier 644. Amplifier 644 has a capacitor 642 coupled between a first output terminal 645 and the positive input terminal of amplifier 644 and the capacitor 640 coupled between a second output terminal 647 and the negative input terminal of amplifier 644, forming an integrator stage. The output signal from amplifier 644 goes on to more stages inside the ADC 130, which for brevity are not shown or discussed. Similarly, the voltage applied to the control terminal of transistor 636 allows a specific amount of current to flow through resistor 634, so that excess voltage is dropped across resistor 634, and the resultant voltage VINN meets the common-mode requirements of the amplifier 644. In an embodiment, the transistors 636 and 638 are variably active, e.g., the transistors are only active when amplifier 654 provides an output voltage, e.g., when switch 655 is closed. The amplifier 644 is provided with a supply voltage, e.g., 1.8V, via supply terminal 683, which is the same supply terminal 683 coupled to the amplifier 654. In an embodiment, the common-mode voltage of the amplifier 644 is the common-mode voltage of the ADC 130, $V_{CMADC}$, e.g., 0.9 V. The common-mode voltage of the ADC 130, $V_{CMADC}$, is one-half of the supply voltage of the ADC 130. In other embodiments, the common-mode voltage can be a voltage level other than one-half of the supply voltage of the ADC 130. Thus, the common-mode voltage of the ADC 130, $V_{CMADC}$, is less than the common-mode voltage of the variable gain amplifier, $V_{CM}$, e.g., 1.8 V.

When amplifier 654 drives enough voltage to achieve the common-mode voltage, $V_{CMADC}$, at the non-inverting input terminal to amplifier 654 that same voltage can cause the common-mode voltage, $V_{CMADC}$, to bias the differential signal at VINN and VINP based on the common features of the resistors 632 and 634 and the transistors 636 and 638 as compared to resistor 656 and transistor 658. Thus, the signal provided to the amplifier 644 is biased to the proper common-mode voltage, $V_{CMADC}$, for the amplifier 644.

Variations in supply voltage or temperature may cause some variations in the variable gain amplifier 116, the voltage follower amplifier 202, resistors 632 and 634, and transistors 636 and 638. However, because the components in the variable gain amplifier half replica module 204 match the corresponding components in the signal path, the same variations occur in replica variable gain amplifier 650, replica voltage follower amplifier 652, resistor 656, and the transistor 658. Therefore, the correct common-mode voltage, $V_{CMADC}$, is maintained at the ADC amplifier 644, in spite of temperature and supply voltage variations. Thus, direct coupling between variable gain amplifier 116 and the ADC 130 is enabled even though the supply voltages are different between variable gain amplifier 116 and the ADC 130. Additionally, the direct coupling between variable gain amplifier 116 and the ADC 130 is enabled even if the ground references are different between the variable gain amplifier 116 and the ADC 130.

According to one aspect, a device is disclosed in accordance with at least one embodiment of the present disclosure. The device includes a first terminal to receive a first common-mode reference voltage. The device also includes a second terminal to receive a second common-mode reference voltage. The device further includes a variable gain amplifier including an input terminal to receive an input signal, an output terminal to provide a first output signal that is biased based on the first common-mode voltage reference, and a supply voltage terminal to receive a first supply voltage. The device also includes a voltage shifter circuit including a first input terminal coupled to the output terminal of the variable gain amplifier, a second input terminal, and an output terminal to provide a third output signal that is biased based on the second common-mode voltage reference. The device further includes a variable gain amplifier half replica module including an output terminal coupled to the second input terminal of the voltage shifter circuit. The variable gain amplifier half replica module to control the third output signal of the voltage shifter circuit based on the first common-mode voltage reference and the second common-mode voltage reference. The device also includes an analog to digital converter including an input terminal coupled to the output terminal of the voltage shifter. The analog to digital converter to provide a digital output signal based on the third output signal.

In an embodiment, the voltage shifter includes a resistor having a first terminal coupled to the output terminal variable gain amplifier, and a second terminal coupled to the input terminal of the analog to digital converter. The voltage shifter also includes a first transistor including a first current electrode terminal coupled to the second terminal of the resistor, a second current electrode terminal coupled to a second voltage reference, and a control terminal coupled to the output terminal of the variable gain amplifier half replica module. In an embodiment, the first transistor is variably active in a linear mode to cause a voltage at the first current electrode terminal to be biased by the second common-mode reference voltage in response to a voltage provided by the variable gain amplifier half replica module.

In an embodiment, the device further includes a first switch having a first terminal coupled to the variable gain amplifier, and the first switch to be closed in response to a determination that the input signal is to be provided to the analog to digital converter. In an embodiment, the device also includes a second switch having a first terminal coupled to the variable gain amplifier, and the second switch to be closed in response to a determination that the input signal is to be provided to external mode circuitry. In an embodiment, the analog to digital converter to provide a digital output signal from the device in response to the first switch being closed, and the external mode circuitry to provide an analog output signal from the device in response to the second switch being closed.

In an embodiment, the variable gain amplifier half replica includes an amplifier including a non-inverting input terminal, an inverting input terminal to receive the second common-mode reference voltage, and an output terminal. In this embodiment, the variable gain amplifier half replica further includes a transistor including a control terminal coupled to the output terminal of the amplifier, a first current electrode is coupled to the non-inverting input terminal of the amplifier, and a second current electrode coupled to a ground voltage reference. The transistor is in a feedback path of the amplifier. In this embodiment, the variable gain amplifier half replica also includes a resistor including a first terminal and a second terminal, wherein the second terminal is coupled first current electrode of the transistor. The resistor and the transistor form second voltage shifter to regulate a first voltage level at the non-inverting input terminal of the amplifier to the second common-mode voltage reference. In this embodiment, a second voltage level is output from the amplifier in response to the first voltage level at the non-inverting input terminal of the amplifier being the second common-mode voltage reference, and the second voltage level causes the voltage shifter to output the third output signal biased based on the second common-mode voltage reference.

In another embodiment, a second voltage level is output from the amplifier in response to the first voltage level at the non-inverting input terminal of the amplifier being the second common-mode voltage reference, and the second voltage level causes the voltage shifter to output the third output signal biased based on the second common-mode voltage reference.

According to one aspect, a method for interfacing a variable gain amplifier with an analog to digital converter is disclosed in accordance with at least one embodiment of the present disclosure. The method includes receiving an input signal at the variable gain amplifier. In an embodiment, the variable gain amplifier has a first supply voltage. The method further includes outputting, from the variable gain amplifier, a first output signal. In an embodiment, the first output signal is biased based on a first common-mode voltage of the variable gain amplifier. The method also includes receiving, at a voltage shifter, the first output signal. The method further includes biasing the first output voltage at a second common-mode voltage of an analog to digital converter. In an embodiment, the second common-mode voltage is an average of a second supply voltage provided to the analog to digital converter. The method also includes receiving, at the analog to digital converter, the first output voltage biased at the second common-mode voltage.

In an embodiment, the method further includes receiving, at the voltage shifter, a voltage to control the biasing of the output voltage. In an embodiment, the voltage is generated in a variable gain amplifier half replica module. In an embodiment, the voltage generated based on the first and second common-mode voltages.

In an embodiment, the method also includes closing a first switch to provide the first output signal to the voltage shifter in response to a determination that the input signal is to be provided to the analog to digital converter. In an embodiment, the method further includes closing a second switch to provide the first output signal to external mode circuitry in response to a determination that the input signal is to be provided to an external analog to digital converter.

According to one aspect, a device is disclosed in accordance with at least one embodiment of the present disclosure. The device includes a first terminal to receive a first common-mode reference voltage. The device also includes a second terminal to receive a second common-mode reference voltage. The device further includes a variable gain amplifier including an input terminal to receive an input signal, an output terminal to provide a first output signal that is biased based on the first common-mode voltage reference, and a supply voltage terminal to receive a first supply voltage. The device also includes a voltage follower amplifier comprising an input terminal coupled to the output terminal of the variable gain amplifier, an output terminal, and a supply voltage terminal to receive the first supply voltage. A second output signal on the output terminal follows the first output signal received from the variable gain amplifier. The device further includes a voltage shifter circuit including a first input terminal coupled to the output terminal of the voltage follower amplifier, a second input terminal, and an output terminal to provide a third output signal that is biased based on the second common-mode voltage reference. The device also includes a variable gain amplifier half replica module comprising an output terminal coupled to the second input terminal of the voltage shifter circuit. The variable gain amplifier half replica module to control the third output signal of the voltage shifter circuit based on the first common-mode voltage reference and the second common-mode voltage reference. The device further includes an analog to digital converter comprising an input terminal coupled to the output terminal of the voltage shifter, and a power supply terminal coupled to a second voltage reference. The analog to digital converter to provide a digital output signal based on the third output signal.

In an embodiment, the device includes a switch having a first terminal coupled to the variable gain amplifier, and a second terminal coupled to the voltage follower amplifier. The first switch to be closed in response to a determination that the input signal is to be provided to the analog to digital converter, and the first output signal is provided to the input terminal of the voltage follower amplifier when the switch is closed.

In an embodiment, the voltage shifter includes a resistor having a first terminal coupled to the output terminal voltage follower amplifier, and a second terminal coupled to the input terminal of the analog to digital converter. The device also includes a first transistor including a first current electrode terminal coupled to the second terminal of the resistor, a second current electrode terminal coupled to a third voltage reference, and a control terminal coupled to the output terminal of the variable gain amplifier half replica module. The first transistor is variably active in a linear mode to cause a voltage at the first current electrode terminal to be biased by the second common-mode reference voltage in response to a voltage provided by the variable gain amplifier half replica module.

In an embodiment, the variable gain amplifier half replica includes an amplifier including a non-inverting input terminal, an inverting input terminal to receive the second common-mode reference voltage, and an output terminal. In an embodiment, the value of the first voltage reference is a desired bias point of the analog to digital converter. The variable gain amplifier half replica further includes a transistor including a control terminal coupled to the output terminal of the amplifier, a first current electrode is coupled to the non-inverting input terminal of the amplifier, and a second current electrode coupled to a ground voltage reference. In an embodiment, the transistor is in a feedback path of the amplifier. The variable gain amplifier half replica also includes a resistor including a first terminal and a second terminal. In an embodiment, the second terminal is coupled first current electrode of the transistor, and the resistor and the transistor form second voltage shifter to regulate a first voltage level at the non-inverting input terminal of the amplifier to the second common-mode voltage reference. In this embodiment, a second voltage level is output from the amplifier in response to the first voltage level at the non-inverting input terminal of the amplifier being the second common-mode voltage reference, and the second voltage level causes the voltage shifter to output the third output signal biased based on the second common-mode voltage reference.

In another embodiment, a second voltage level is output from the amplifier in response to the first voltage level at the non-inverting input terminal of the amplifier being the second common-mode voltage reference, and the second voltage level causes the voltage shifter to output the third output signal biased based on the second common-mode voltage reference.

Embodiments of the present disclosure also relates to a device comprising: a first terminal to receive a first common-mode reference voltage; a second terminal to receive a second common-mode reference voltage; a variable gain amplifier comprising an input terminal to receive an input signal, an output terminal to provide a first output signal that is biased based on the first common-mode voltage reference, and a supply voltage terminal to receive a first supply voltage; a voltage follower amplifier comprising an input terminal coupled to the output terminal of the variable gain amplifier, an output terminal, and a supply voltage terminal to receive the first supply voltage, wherein a second output signal on the output terminal follows the first output signal received from the variable gain amplifier; a voltage shifter circuit comprising a first input terminal coupled to the output terminal of the voltage follower amplifier, a second input terminal, and an output terminal to provide a third output signal that is biased based on the second common-mode voltage reference; a variable gain amplifier half replica module comprising an output terminal coupled to the second input terminal of the voltage shifter circuit, the variable gain amplifier half replica module to control the third output signal of the voltage shifter circuit based on the first common-mode voltage reference and the second common-mode voltage reference; and an analog to digital converter comprising an input terminal coupled to the output terminal of the voltage shifter, and a power supply terminal coupled to a second voltage reference, the analog to digital converter to provide a digital output signal based on the third output signal.

The device may further comprise: switch having a first terminal coupled to the variable gain amplifier, and a second terminal coupled to the voltage follower amplifier, the first switch to be closed in response to a determination that the input signal is to be provided to the analog to digital converter, wherein the first output signal is provided to the input terminal of the voltage follower amplifier when the switch is closed.

The voltage shifter may comprise: a resistor having a first terminal coupled to the output terminal voltage follower amplifier, and a second terminal coupled to the input terminal of the analog to digital converter; and a first transistor comprising a first current electrode terminal coupled to the second terminal of the resistor, a second current electrode terminal coupled to a third voltage reference, and a control terminal coupled to the output terminal of the variable gain amplifier half replica module, wherein the first transistor is variably active in a linear mode to cause a voltage at the first current electrode terminal to be biased by the second common-mode reference voltage in response to a voltage provided by the variable gain amplifier half replica module.

The variable gain amplifier half replica may comprise: an amplifier comprising a non-inverting input terminal, an inverting input terminal to receive the second common-mode reference voltage, and an output terminal, wherein the value of the first voltage reference is a desired bias point of the analog to digital converter;

a transistor comprising a control terminal coupled to the output terminal of the amplifier, a first current electrode is coupled to the non-inverting input terminal of the amplifier, and a second current electrode coupled to a ground voltage reference, wherein the transistor is in a feedback path of the amplifier; and a resistor comprising a first terminal and a second terminal, wherein the second terminal is coupled first current electrode of the transistor, wherein the resistor and the transistor form second voltage shifter to regulate a first voltage level at the non-inverting input terminal of the amplifier to the second common-mode voltage reference.

A second voltage level may be output from the amplifier in response to the first voltage level at the non-inverting input terminal of the amplifier being the second common-mode voltage reference, wherein the second voltage level causes the voltage shifter to output the third output signal biased based on the second common-mode voltage reference.

A second voltage level may be output from the amplifier in response to the first voltage level at the non-inverting input terminal of the amplifier being the second common-mode voltage reference, wherein the second voltage level causes the voltage shifter to output the third output signal biased based on the second common-mode voltage reference.

Other embodiments, uses, and advantages of the disclosure will be apparent to those skilled in the art from consideration of the specification and practice of the disclosure disclosed herein. The specification and drawings should be considered as examples only, and the scope of the disclosure is accordingly intended to be limited only by the following claims and equivalents thereof. For example, one skilled in the art would appreciate that a data processing system, such as a computer having an instruction based data processor, can be used to implement the analysis described herein.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A device comprising:
   a first terminal to receive a first common-mode reference voltage;
   a second terminal to receive a second common-mode reference voltage;
   a variable gain amplifier comprising an input terminal to receive an input signal, an output terminal to provide a first output signal that is biased based on the first common-mode voltage reference, and a supply voltage terminal to receive a first supply voltage;
   a voltage shifter circuit comprising a first input terminal coupled to the output terminal of the variable gain amplifier, a second input terminal, and an output terminal to provide a third output signal that is biased based on the second common-mode voltage reference;
   a variable gain amplifier half replica module comprising an output terminal coupled to the second input terminal of the voltage shifter circuit, the variable gain amplifier half replica module to control the third output signal of the voltage shifter circuit based on the first common-mode voltage reference and the second common-mode voltage reference; and
   an analog to digital converter comprising an input terminal coupled to the output terminal of the voltage shifter, the analog to digital converter to provide a digital output signal based on the third output signal.

2. The device circuit of claim 1, wherein the voltage shifter comprises:
   a resistor having a first terminal coupled to the output terminal variable gain amplifier, and a second terminal coupled to the input terminal of the analog to digital converter; and
   a first transistor comprising a first current electrode terminal coupled to the second terminal of the resistor, a second current electrode terminal coupled to a second voltage reference, and a control terminal coupled to the output terminal of the variable gain amplifier half replica module, wherein the first transistor is variably active in a linear mode to cause a voltage at the first current electrode terminal to be biased by the second common-mode reference voltage in response to a voltage provided by the variable gain amplifier half replica module.

3. The device of claim 1, further comprising:
   a first switch having a first terminal coupled to the variable gain amplifier, the first switch to be closed in response to a determination that the input signal is to be provided to the analog to digital converter.

4. The device of claim 3, further comprising:
   a second switch having a first terminal coupled to the variable gain amplifier, the second switch to be closed in response to a determination that the input signal is to be provided to external mode circuitry.

5. The device of claim 3, the analog to digital converter to provide a digital output signal from the device in response to the first switch being closed, and the external mode circuitry to provide an analog output signal from the device in response to the second switch being closed.

6. The device of claim 1, wherein the variable gain amplifier half replica comprises:
   an amplifier comprising a non-inverting input terminal, an inverting input terminal to receive the second common-mode reference voltage, and an output terminal;
   a transistor comprising a control terminal coupled to the output terminal of the amplifier, a first current electrode is coupled to the non-inverting input terminal of the amplifier, and a second current electrode coupled to a ground voltage reference, wherein the transistor is in a feedback path of the amplifier; and
   a resistor comprising a first terminal and a second terminal, wherein the second terminal is coupled first current electrode of the transistor, wherein the resistor and the transistor form second voltage shifter to regulate a first voltage level at the non-inverting input terminal of the amplifier to the second common-mode voltage reference.

7. The device of claim 6, wherein a second voltage level is output from the amplifier in response to the first voltage level at the non-inverting input terminal of the amplifier being the second common-mode voltage reference, wherein the second voltage level causes the voltage shifter to output the third output signal biased based on the second common-mode voltage reference.

8. The device of claim 1, wherein a second voltage level is output from the amplifier in response to the first voltage level at the non-inverting input terminal of the amplifier being the second common-mode voltage reference, wherein the second voltage level causes the voltage shifter to output the third output signal biased based on the second common-mode voltage reference.

9. A method of interfacing a variable gain amplifier with an analog to digital converter, the method comprising:
   receiving an input signal at the variable gain amplifier, wherein the variable gain amplifier has a first supply voltage;
   outputting, from the variable gain amplifier, a first output signal, wherein the first output signal is biased based on a first common-mode voltage of the variable gain amplifier;
   receiving, at a voltage shifter, the first output signal;
   biasing the first output voltage at a second common-mode voltage of an analog to digital converter, wherein the second common-mode voltage is half of a second supply voltage provided to the analog to digital converter; and
   receiving, at the analog to digital converter, the first output voltage biased at the second common-mode voltage.

10. The method of claim 9, further comprising:
    receiving, at the voltage shifter, a voltage to control the biasing of the output voltage.

11. The method of claim 10, wherein the voltage is generated in a variable gain amplifier half replica module.

12. The method of claim 10, wherein the voltage generated based on the first and second common-mode voltages.

13. The method of claim 9, further comprising:
    closing a first switch to provide the first output signal to the voltage shifter in response to a determination that the input signal is to be provided to the analog to digital converter.

14. The method of claim 13, further comprising:
  closing a second switch to provide the first output signal to external mode circuitry in response to a determination that the input signal is to be provided to an external analog to digital converter.

* * * * *